(12) United States Patent
Chen et al.

(10) Patent No.: US 7,714,347 B2
(45) Date of Patent: May 11, 2010

(54) CASTING FOR AN LED MODULE

(75) Inventors: Ying-Tso Chen, Yingge Township, Taipei County (TW); Teng-Huei Huang, Baoshan Township, Hsinchu County (TW)

(73) Assignee: Lighthouse Technology Co., Ltd., Hsinchu County (TW)

( * ) Notice: Subject to any disclaimer, the term of this patent is extended or adjusted under 35 U.S.C. 154(b) by 72 days.

(21) Appl. No.: 11/518,936

(22) Filed: Sep. 12, 2006

(65) Prior Publication Data

US 2007/0284605 A1 Dec. 13, 2007

(30) Foreign Application Priority Data

Jun. 13, 2006 (TW) ............... 95210311 U

(51) Int. Cl.
*H01L 29/74* (2006.01)
(52) U.S. Cl. .......... 257/99; 257/E25.005; 257/E33.058
(58) Field of Classification Search .......... 257/99, 257/E25.005, E33.058
See application file for complete search history.

(56) References Cited

U.S. PATENT DOCUMENTS

| | | | |
|---|---|---|---|
| 6,274,890 B1 * | 8/2001 | Oshio et al. ............... 257/98 |
| 6,340,824 B1 * | 1/2002 | Komoto et al. ............ 257/99 |
| D453,745 S * | 2/2002 | Suenaga .................. D13/180 |
| D490,387 S * | 5/2004 | Yagi ....................... D13/182 |
| 6,733,711 B2 * | 5/2004 | Durocher et al. ....... 264/272.14 |
| 6,747,293 B2 * | 6/2004 | Nitta et al. ............... 257/99 |
| D534,505 S * | 1/2007 | Kamada .................. D13/180 |
| 2001/0042865 A1 * | 11/2001 | Oshio et al. ............. 257/100 |
| 2002/0190262 A1 * | 12/2002 | Nitta et al. ............... 257/99 |
| 2004/0056265 A1 * | 3/2004 | Arndt et al. .............. 257/98 |
| 2004/0217369 A1 * | 11/2004 | Nitta et al. ............... 257/99 |
| 2007/0063213 A1 * | 3/2007 | Hsieh et al. .............. 257/99 |

* cited by examiner

*Primary Examiner*—Bradley K Smith
*Assistant Examiner*—Alexander Belousov
(74) *Attorney, Agent, or Firm*—Rosenberg, Klein & Lee

(57) ABSTRACT

A casting adapted to carry a light emitting diode die and an anti-static die is disclosed. The casting comprises two electrodes for opposite electrodes and a wall. The light emitting diode die is mounted one of electrodes and the anti-static die is mounted on the other electrode. The wall is arranged between the light emitting diode die and the anti-static die. Further, the height of the wall is larger than that of the anti-static die to shade the anti-static die, whereby reflecting the light emitted from the light emitting diode die. Therefore, the reflection ratio of the light emitting diode die is improved, and the intensity generated by the whole light emitting diode is also improved.

6 Claims, 5 Drawing Sheets

CASTING FOR AN LED MODULE

BACKGROUND OF THE INVENTION

1. Field of the Invention

The present invention relates to a casting for a light emitting diode (hereinafter refers to LED) module, more specifically, to a casting adapted to carry an LED die and an anti-static die, and provided with a wall formed therein, wherein the wall can shelter the anti-static die from the LED die and reflect the light emitted from the LED die more efficiency.

2. Description of the Related Art

As shown in FIG. 1, in the conventional LED module, two electrodes 11, 11' are mounted in a casting 10. The electrode 11 is used to carry the LED die and the electrode 11' is used to carry the anti-static die. The LED die 20 is connected with two electrodes 11, 11' via wires 21, and the anti-static die 30 is connected with the electrode 11 via wire 31. Furthermore, an encapsulation layer 40 in the casting 10 covers the anti-static die 30. Once a voltage is applied to the electrodes 11, 11', the LED die 20 will emit light, and meanwhile the anti-static die 30 can prevent the LED from being damaged by static charges.

However, in the conventional LED module, the LED die 20 and the anti-static die 30 respectively mounted on the electrodes 11, 11' have certain thickness that cannot be ignored. The light emitted from the LED die 20 presents a good reflection ratio between the inner surface of the casting 10 and the electrode 11 in the casting 10. However, the light emitted from the LED decades since the anti-static die 30 shields and absorbs some of the light, causing the intensity of the whole LED module decreases.

Therefore, in view of the above drawbacks of the prior casting, the inventor proposes the present invention to overcome the above problems based on his deliberate researches and related principles.

SUMMARY OF THE INVENTION

The object of the present invention is to provide a casting adapted to carry a LED die and an anti-static die and provided with a wall therein, whereby the anti-static die is shielded and the reflection ratio of the LED die is improved. Thus, the intensity of the whole LED module is effectively improved.

To achieve the above object, according to the present invention, the casting comprises two electrodes and a wall. The LED die is mounted one of electrodes and the anti-static die is mounted on the other electrode. The wall is arranged between the LED die and the anti-static die, and the height of the wall is larger than that of the anti-static die.

BRIEF DESCRIPTION OF THE DRAWINGS

The characteristics and the technical content of the present invention will be further understood in view of the detailed description and accompanying drawings, in which.

DETAILED DESCRIPTION OF THE PREFERRED EMBODIMENTS

Figure 1:
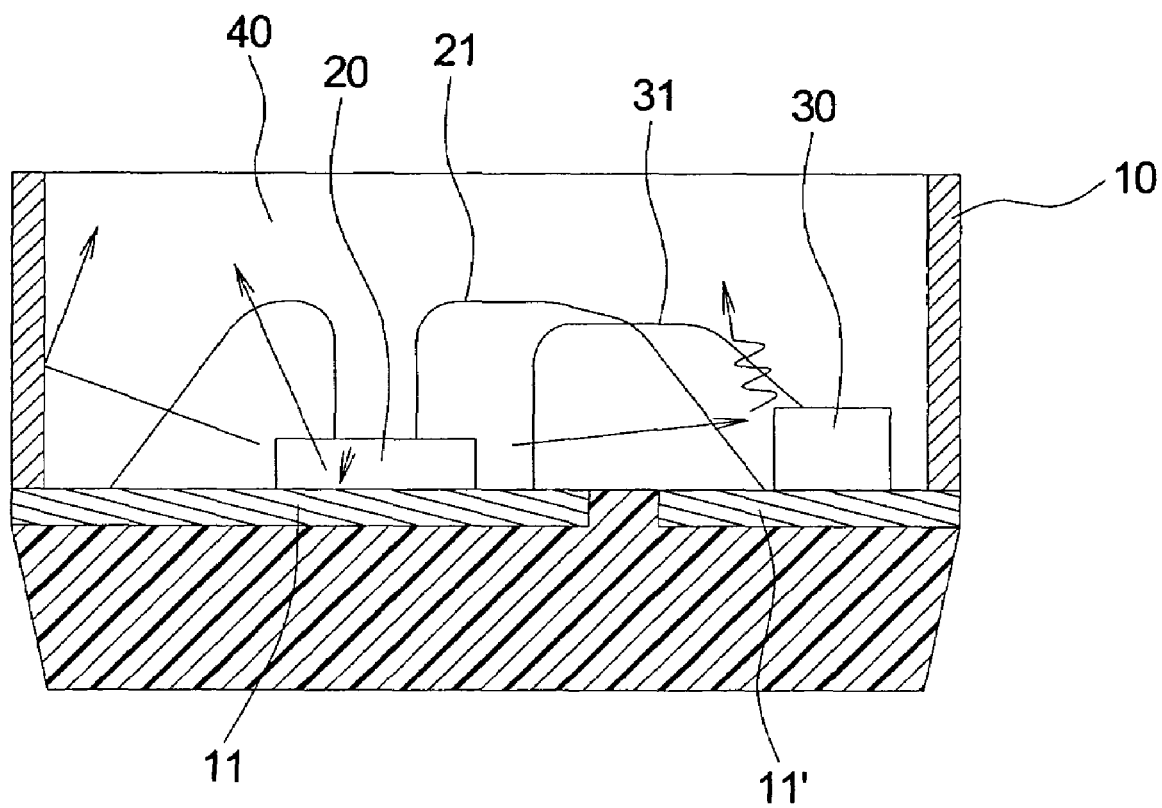
FIG. 1 is a cross-sectional view illustrating a conventional casting for an LED module.
Figure 2:
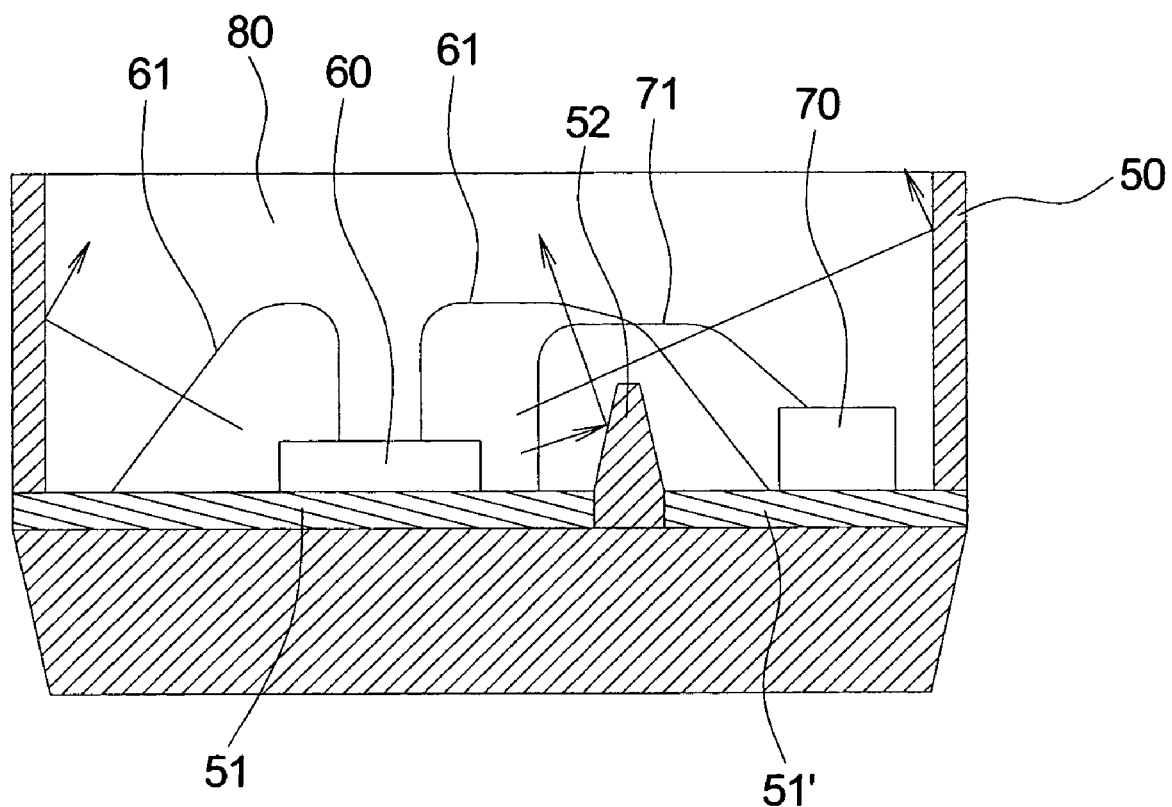
FIG. 2 is a cross-sectional view showing a casting for an LED module according to a preferred embodiment of the present invention.

Referring to FIG. 2, a casting for an LED module according to the present invention is disclosed. An LED die is mounted in a cup-like casting 50, which is provided with two electrodes 51, 51', i.e. a positive electrode and a negative electrode. The electrodes 51, 51' are used to carry a LED die 60 and an anti-static die 70 respectively. The LED die 60 is insulatedly mounted on the positive electrode 51, and also connected with the electrodes 51, 51' via two first wires 61.

The anti-static die 70 is mounted on the other electrode 51'. In this example, the anti-static die 70 can be soldered on the negative electrode 51' and electrically connected with the positive electrode 51 via one second wire 71. A transparent encapsulation layer 80, such as epoxy resin, is filled into the casting 50 to cover the LED die 60 and anti-static die 70 to prevent the LED die 60 and anti-static die 70 from being damaged by the moisture entering the casting 50. Once a proper voltage is applied to the electrodes 51, 51', the LED die 60 emits light, and meanwhile it is free from the static charges under the protection of the anti-static die 70.

According to the present invention, a wall 52 is provided between the electrodes 51, 51', i.e. between the LED die and the anti-static die, and protrudes therefrom. The wall 52 can separate the polarities of both electrodes 51, 51' and it is also higher than the LED die 60 and the anti-static die 70. The wall 52 and the casting 50 are made of an insulated high polymer material having a high reflection ratio, such as polyphthalamide (PPA), epoxy resin or ceramics. Alternatively, they can be made of material having a reflection ratio higher than that of the anti-static die 70, such as ceramics.

Figure 3:
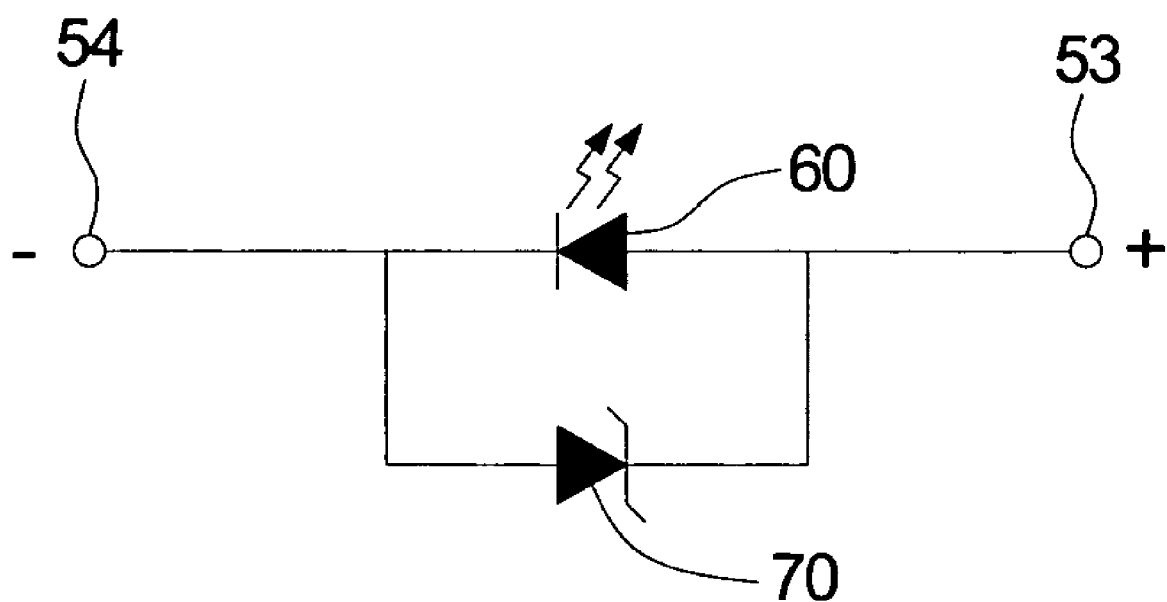
FIG. 3 is a circuit diagram showing a protection circuit used in the casting shown in FIG. 2.

As shown in FIG. 3, the LED die is electrically connected with a positive electrode 53 and a negative electrode 54, i.e. two electrodes 51, 51', and also connected with LED die 60 and anti-static die 70 in parallel. The positive electrode 53 and a negative electrode 54 are reversely connected. Once the static charges occur, they can pass by the LED die via the path of the anti-static die 70. If the overly high voltage is applied to the LED module, the static charges will probably damage the LED die 60 without the path of the anti-static die 70.

In view of the above, the wall 52 formed between the electrodes 51, 51' replaces the anti-static die 70 to serves a better mechanism for reflecting the light emitted from the LED die 60, reducing the possibility that the light travels to the anti-static die 70 directly. Additionally, the wall 52 can be made of the same material as that the casting 50 is made of or a material having a reflection ratio higher than that of the anti-static die 70. Thus, the wall 52 can reflect the light emitted from the LED die 60 to enhance the intensity of the whole LED module effectively.

Figure 4:
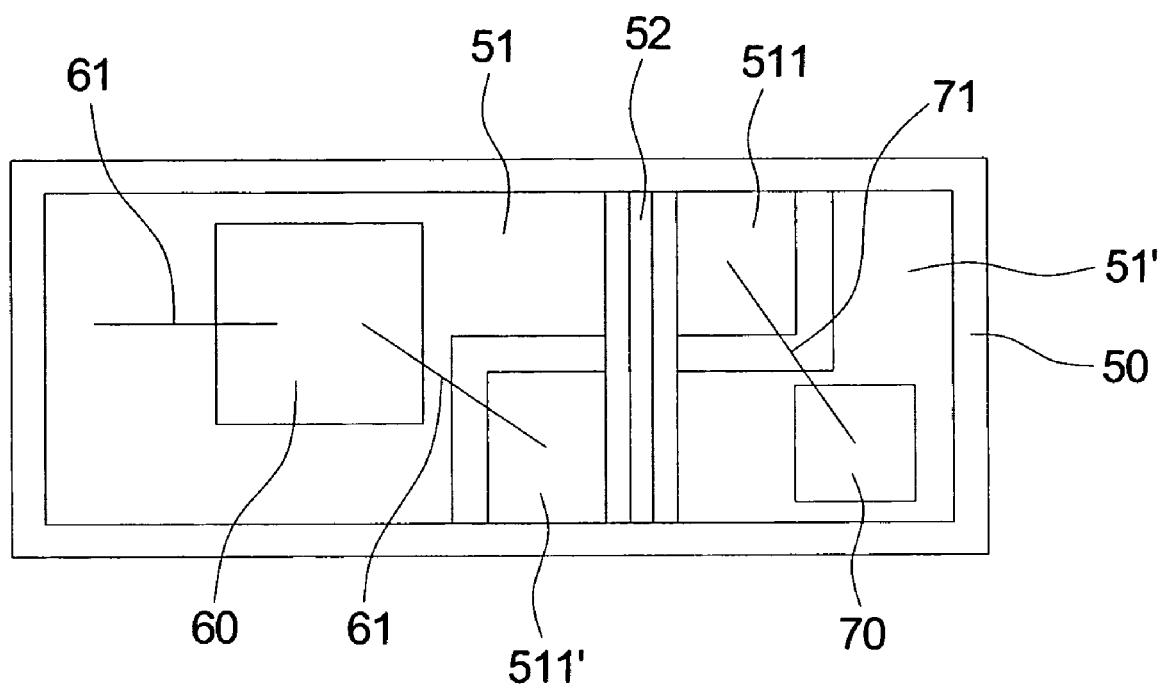
FIG. 4 is a top view showing the another casting for an LED module.
Figure 5:
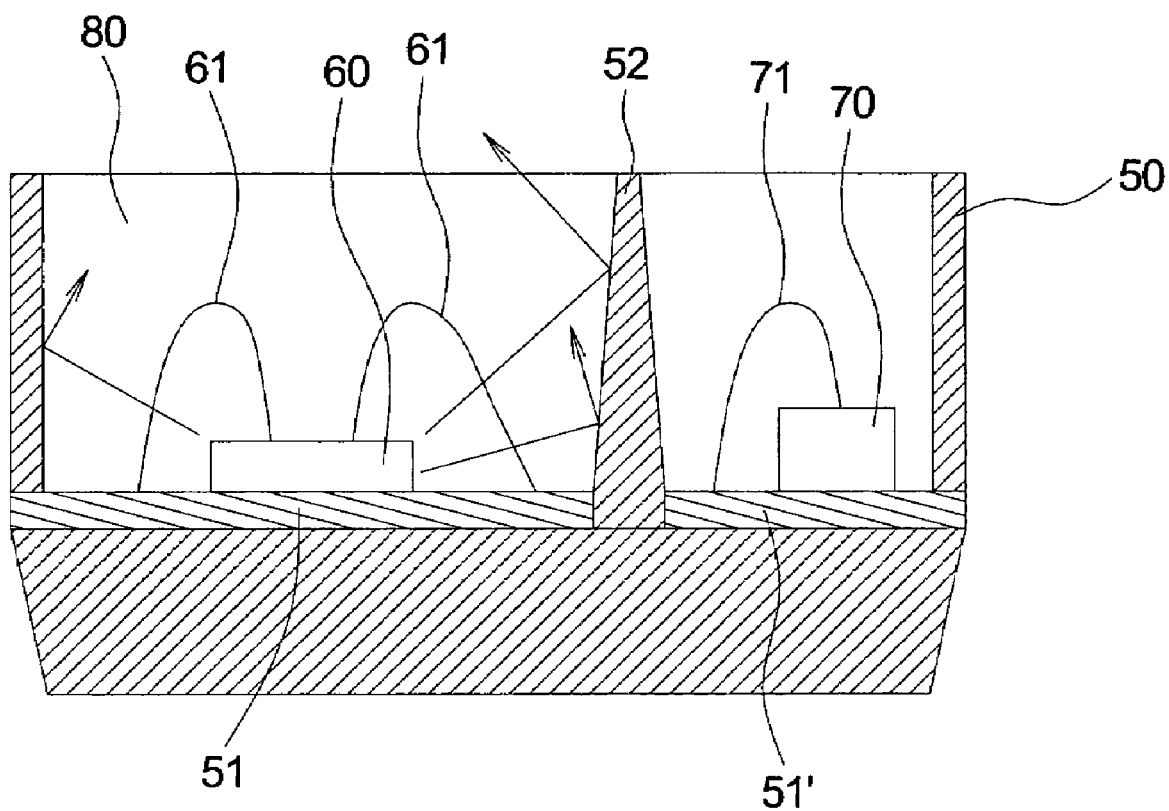
FIG. 5 is a cross-sectional view showing the casting for an LED module shown in FIG. 4.

Another aspect of the embodiment is shown in FIGS. 4 and 5. One end of each of the electrodes 51, 51' intersects with each other and penetrates the wall 52 to form floors 511, 511' respectively. The floors 511, 511' respectively extends from the wall 52. The first wire 61 and the second wire 71 are respectively connected with the floors 511, 511'. Moreover, the height of the wall 52 is exactly the same as the depth of the casting 50.

Consequently, since the tops of both the wall 52 and the casting 50 locate at the same level, the light emitted from the LED die 60 can evenly distribute and an even intensity of the whole LED module can be obtained. The floors 511, 511' allow the first wire 61 and the second wire 71 to be connected with the electrodes 51, 51' respectively without the influence of the height of the wall 52.

Although the present invention has been described with reference to the aforementioned preferred embodiment, it will be understood that the invention is not limited to the details thereof. Various equivalent variations and modifications can still occur by those skilled in this art in view of the teachings of the present invention. Thus, all such variations and equivalent modifications are also included within the scope of the invention as defined in the appended claims.

What is claimed is:

1. A casting adapted to carry a light emitting diode die and an anti-static die, the casting comprising:
    a cup shaped portion, the light emitting diode die and the anti-static die being disposed therein, said light emitting diode die being displaced from said anti-static die within said cup shaped portion;
    two electrodes disposed in the cup shaped portion, the light emitting diode die being mounted on one of the electrodes and the anti-static die being mounted on the other electrode;
    a wall disposed within said cup shaped portion, said wall being mounted between and contiguous with said two electrodes, wherein said wall partitions said cup shaped portion into a first cavity and a second cavity, said first cavity containing said light emitting diode die and said second cavity containing said anti-static die whereby the light emitted by said light emitting diode die is reflected from said wall of the first cavity without any interference of said light by said anti-static die, a height of said wall being greater than that of the anti-static die;
    wherein each of said two electrodes are disposed on either side of said wall, said wall protruding from said casting, one end of each of the electrodes respectively intersecting with each other and penetrating said wall to form a protruded portion, each of said protruded portions respectively extending from said wall, and said protruded portions, light emitting diode die and anti-static die being electrically connected by a wire.

2. The casting as claimed in claim 1 further comprising an encapsulation layer covering the light emitting diode die and the anti-static die provided in the casting.

3. The casting as claimed in claim 1, wherein the casting and the wall are made of a high polymer insulated material.

4. The casting as claimed in claim 1, wherein the light emitting diode die is insulatedly mounted on one of the electrodes, and the electrodes and light emitting diode die are connected by wire.

5. The casting as claimed in claim 1, wherein the anti-static die is soldered on one of the electrodes, and the anti-static die and other electrode are connected by wire.

6. The casting as claimed in claim 1, wherein the wall is made of a material whose reflection ratio is higher than that of the anti-static die.

* * * * *